US012700722B2

(12) United States Patent
Vogel

(10) Patent No.: US 12,700,722 B2
(45) Date of Patent: Aug. 4, 2026

(54) QUICK-CONNECT CLOSURE AND HANDHOLE SYSTEM

(71) Applicant: AFL Telecommunications LLC, Duncan, SC (US)

(72) Inventor: Mark Vogel, Greenville, SC (US)

(73) Assignee: AFL Telecommunications LLC, Duncan, SC (US)

( * ) Notice: Subject to any disclaimer, the term of this patent is extended or adjusted under 35 U.S.C. 154(b) by 708 days.

(21) Appl. No.: 18/120,666

(22) Filed: Mar. 13, 2023

(65) Prior Publication Data

US 2023/0299570 A1    Sep. 21, 2023

Related U.S. Application Data

(60) Provisional application No. 63/321,148, filed on Mar. 18, 2022.

(51) Int. Cl.
H02G 9/10        (2006.01)
H05K 5/02        (2006.01)
(52) U.S. Cl.
CPC ............. H02G 9/10 (2013.01); H05K 5/0217 (2013.01); H05K 5/0247 (2013.01)
(58) Field of Classification Search
CPC ....... H02G 9/10; H05K 5/0217; H05K 5/0247
USPC .................................................. 52/20; 174/37
See application file for complete search history.

(56) References Cited

U.S. PATENT DOCUMENTS

2018/0196201 A1 * 7/2018 Chai ......................... G02B 6/36
2021/0384977 A1 * 12/2021 Smith ..................... H04B 10/25
2024/0427093 A1 * 12/2024 Vastmans ............. G02B 6/4469

FOREIGN PATENT DOCUMENTS

WO    WO-2019148432 A1 * 8/2019 ............... G02B 6/44

OTHER PUBLICATIONS

Fiber Distribution System_LGX_pp. 1-1 to 16-33_Jan. 2002.*
Focused Fiber Solutions_Multilink_pp. 1 to 139 _Nov. 2020.*
Optical MTP Connector White Paper (Fig 8 marked-up)_Neutrik_ pp. 1 to 8_2016.*
Ultra-Compact MPO Connector_Kamada et al._ pp. 117-120_Apr. 2016.*

* cited by examiner

*Primary Examiner* — Timothy J Thompson
*Assistant Examiner* — Guillermo J Egoavil
(74) *Attorney, Agent, or Firm* — Dority & Manning, P.A.

(57)        ABSTRACT

A handhole system, a quick-connect telecommunications system, and a method for fiber optic connection at a handhole is provided. A plurality of closures includes a sealed body including a multi-port connector corresponding to a plurality of optical fibers extending from an interior of the body to an exterior. A connector body has a hub including a plurality of receptacles having a plurality of connectors configured to receive respective multi-port connectors from the plurality of closures. The connector body includes a neck having an input cable port configured to receive an input cable connector and an output cable port configured to receive an output cable connector. The neck is coupled to the hub to communicatively couple the input cable port and output cable port to the plurality of receptacles at the hub. The plurality of receptacles is configured to communicatively couple respective closures to the input cable and the output cable.

19 Claims, 3 Drawing Sheets

100

110

124

122

140

120

130

142

136

134

110

114

120

112

124

128

126

122

136

134

118

116

110

112

114

QUICK-CONNECT CLOSURE AND HANDHOLE SYSTEM

CROSS REFERENCE TO RELATED APPLICATIONS

The present application claims priority to U.S. Provisional Application Ser. No. 63/321,148, filed on Mar. 18, 2022 and which is incorporated by reference herein in its entirety.

FIELD

The present disclosure relates generally to handholes for use in various industries such as telecommunications, water, etc., and more particularly to the use of closures in such handholes.

BACKGROUND

Telecommunications equipment may be positioned in handholes or vault systems in the ground at which a telecommunications technician may route, connect, splice, split, or perform other tasks related to operating telecommunications systems (e.g., fiber optic networks).

A significant problem with current handhole and vault systems is that fiber optic termination at a location in the handhole requires on-site splicing at a minimum of one time. Splicing may generally be required every time future connections are made, such as to require a technician to break the seal of the splice closure within the handhole, splice and seal the required connections, and then reseal the closure successfully. However, such systems and methods present ergonomic challenges to the technician. Such systems may furthermore leave closures and connections susceptible to leakage or environmental exposure related to repeated unsealing and sealing, or damaged splices, or difficulties to the user to perform fiber optic tasks.

Accordingly, improved handhole and connection systems would be advantageous. Specifically, handhole and connection systems that address one of more of the above-stated deficiencies would be advantageous.

BRIEF DESCRIPTION

Aspects and advantages of the invention in accordance with the present disclosure will be set forth in part in the following description, or may be obvious from the description, or may be learned through practice of the technology.

An aspect of the present disclosure is directed to a handhole system. The system includes a plurality of walls forming a handhole volume, wherein one or more of the plurality of walls forms an opening through which an input cable and an output cable is extendable into the volume. The system includes a plurality of closures in which each closure has a sealed body including a multi-port connector corresponding to a plurality of optical fibers extending from an interior of the body to an exterior. A connector body includes a hub, the hub having a plurality of receptacles having a plurality of connectors configured to receive respective multi-port connectors from the plurality of closures. The connector body includes a neck including an input cable port configured to receive an input cable connector from the input cable and an output cable port configured to receive an output cable connector from the output cable. The neck is coupled to the hub to communicatively couple the input cable port and output cable port to the plurality of receptacles at the hub. The plurality of receptacles is configured to communicatively couple respective closures to the input cable and the output cable.

Another aspect of the present disclosure is directed to a quick connect telecommunications system. The system includes a plurality of closures in which each closure includes a sealed body including a multi-port connector corresponding to a plurality of optical fibers extending from an interior of the body to an exterior. The quick connect telecommunications system includes a connector body having a hub. The hub includes a plurality of receptacles extending into the hub. Each receptacle includes a respective connector configured to receive respective multi-port connectors from the plurality of closures. The connector body includes a neck having an input cable port configured to receive an input cable connector from the input cable and an output cable port configured to receive an output cable connector from the output cable. The neck is coupled to the hub to communicatively couple the input cable port and output cable port to the plurality of receptacles at the hub. The plurality of receptacles is configured to communicatively couple respective closures to the input cable and the output cable.

Yet another aspect of the present disclosure is directed to a method for fiber optic connection at a handhole. The method includes pre-terminating, testing, and sealing a plurality of fiber optic closures each including a range of optical fiber connections corresponding to a subdivision of a multi-fiber receptacle hub; operably connecting one or more of the plurality of fiber optic closures to respective connectors at a connector body including the multi-fiber receptacle hub at a handhole volume; and operably connecting an input cable and an output cable to the plurality of fiber optic closures via an input port and an output port positioned at the connector body.

These and other features, aspects and advantages of the present invention will become better understood with reference to the following description and appended claims. The accompanying drawings, which are incorporated in and constitute a part of this specification, illustrate embodiments of the technology and, together with the description, serve to explain the principles of the technology.

BRIEF DESCRIPTION OF THE DRAWINGS

A full and enabling disclosure of the present subject matter, including the best mode thereof, directed to one of ordinary skill in the art, is set forth in the specification, which makes reference to the appended figures, in which.

Figure 1:
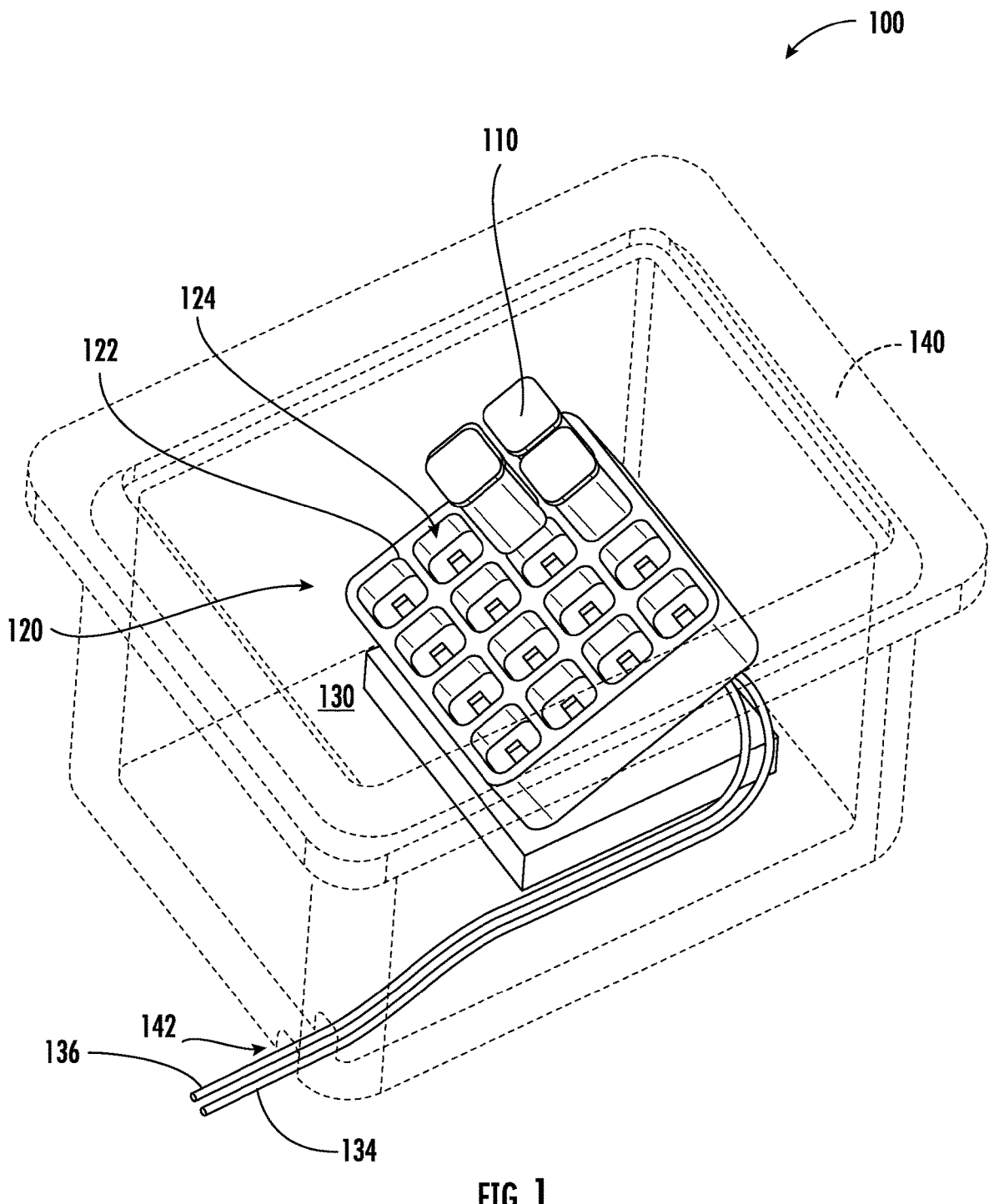
FIG. 1 provides a perspective view of an embodiment of a telecommunications connector system in accordance with aspects of the present disclosure.

Repeat use of reference characters in the present specification and drawings is intended to represent the same or analogous features or elements of the present invention.

DETAILED DESCRIPTION

Reference now will be made in detail to embodiments of the present invention, one or more examples of which are illustrated in the drawings. The word "exemplary" is used herein to mean "serving as an example, instance, or illustration." Any implementation described herein as "exemplary" is not necessarily to be construed as preferred or advantageous over other implementations. Moreover, each example is provided by way of explanation, rather than limitation of, the technology. In fact, it will be apparent to those skilled in the art that modifications and variations can be made in the present technology without departing from the scope or spirit of the claimed technology. For instance, features illustrated or described as part of one embodiment can be used with another embodiment to yield a still further embodiment. Thus, it is intended that the present disclosure covers such modifications and variations as come within the scope of the appended claims and their equivalents. The detailed description uses numerical and letter designations to refer to features in the drawings. Like or similar designations in the drawings and description have been used to refer to like or similar parts of the invention.

As used herein, the terms "first", "second", and "third" may be used interchangeably to distinguish one component from another and are not intended to signify location or importance of the individual components. The singular forms "a," "an," and "the" include plural references unless the context clearly dictates otherwise. The terms "coupled," "fixed," "attached to," and the like refer to both direct coupling, fixing, or attaching, as well as indirect coupling, fixing, or attaching through one or more intermediate components or features, unless otherwise specified herein. As used herein, the terms "comprises," "comprising," "includes," "including," "has," "having" or any other variation thereof, are intended to cover a non-exclusive inclusion. For example, a process, method, article, or apparatus that comprises a list of features is not necessarily limited only to those features but may include other features not expressly listed or inherent to such process, method, article, or apparatus. Further, unless expressly stated to the contrary, "or" refers to an inclusive- or and not to an exclusive- or. For example, a condition A or B is satisfied by any one of the following: A is true (or present) and B is false (or not present), A is false (or not present) and B is true (or present), and both A and B are true (or present).

Ranges provided herein are inclusive of their end points. For instance, a range of 1 to 100 includes 1 and 100.

Terms of approximation, such as "about," "generally," "approximately," or "substantially," include values within a ten percent full scale error from a lowest value embodiment to a highest value embodiment. For instance, an embodiment including a range from approximately 10 to approximately 100 with a ten percent full scale error may include values from 1 to 109.

Benefits, other advantages, and solutions to problems are described below with regard to specific embodiments. However, the benefits, advantages, solutions to problems, and any feature(s) that may cause any benefit, advantage, or solution to occur or become more pronounced are not to be construed as a critical, required, or essential feature of any or all the claims.

Figures 2, 3:
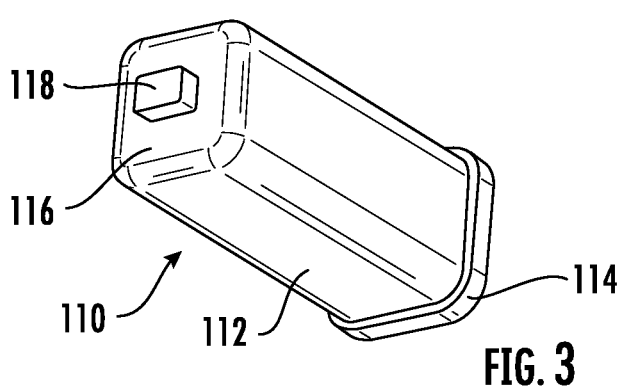
FIG. 2 provides a perspective view of an embodiment of a connector body of the telecommunications connector system in accordance with aspects of the present disclosure.
FIG. 3 provides a perspective view of an embodiment of a fiber optic closure for the telecommunications connector system in accordance with aspects of the present disclosure.
Figure 4:
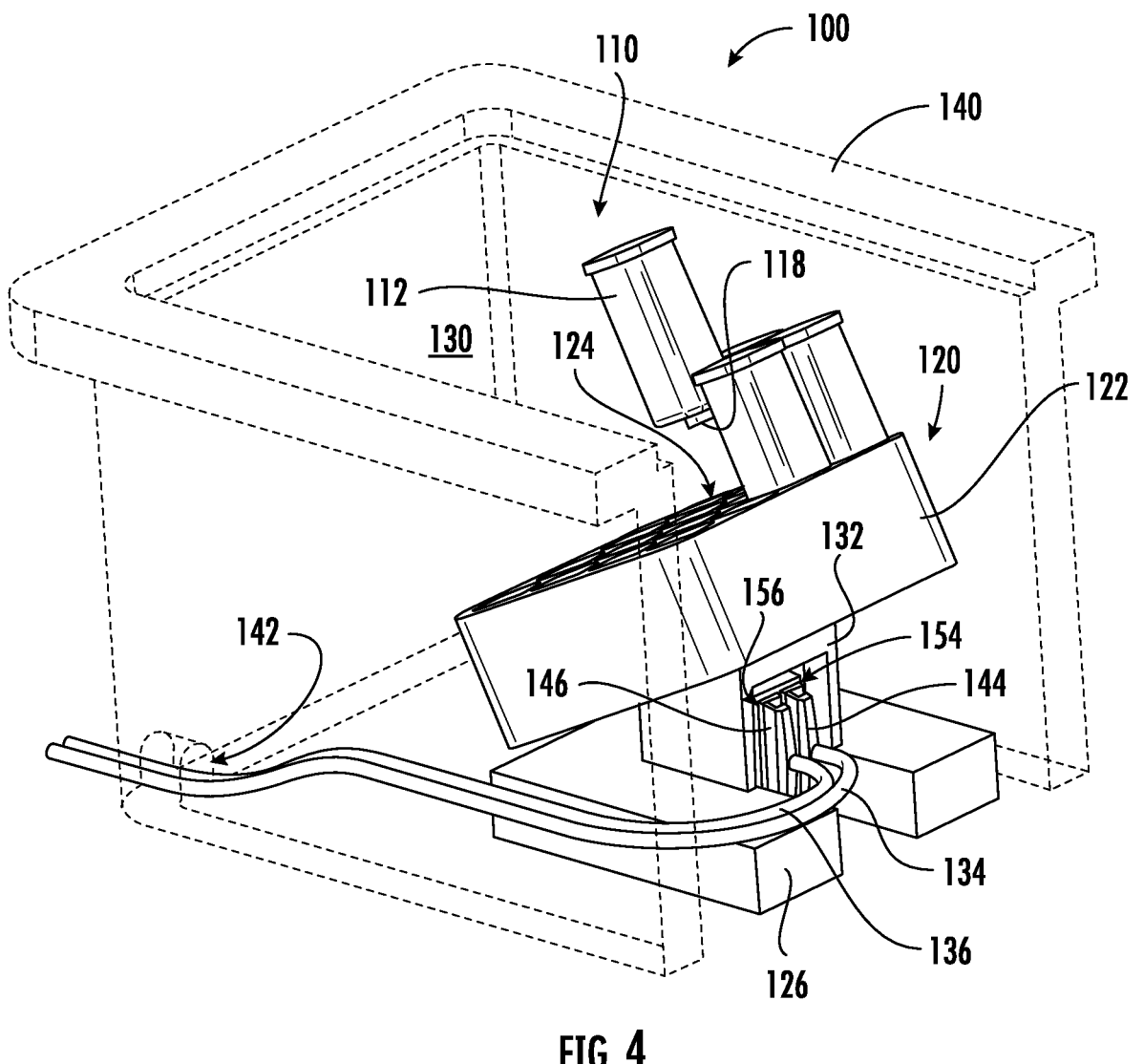
FIG. 4 provides a perspective view of an embodiment of a telecommunications connector system in accordance with aspects of the present disclosure.

Referring now to the drawings, FIGS. 1-4 provide embodiments of a telecommunications connector system 100 (hereinafter, "system 100") that may address one or more of the above-identified problems. Embodiments of the system 100 provided herein include a plurality of closures 110 insertable to a connector body 120. The closure 110 forms a quick-connect/quick-disconnect pre-wired body that can be inserted into the connector body 120 including a multi-receptacle hub 122. The hub 122 includes a plurality of receptacles 124 each configured to receive a respective closure 110. The connector body 120 is placeable in a volume 130, such as a vault, cabinet, or handhole formed by walls 140 for storing, placing, or positioning telecommunications equipment.

The connector body 120 includes the hub 122 including a base 126 configured to position on the ground in the volume 130. The hub 122 may be connected to the base 126 at an oblique angle relative to the ground and a vertical axis. The hub 122 may be attached to the base 126 in pivotable arrangement, such as to allow the hub 122 to rotate from substantially parallel to the ground to the oblique angle between the vertical axis and the ground. The connector body 120 may include a neck 132 extending substantially along the vertical axis between the base 126 and the hub 122.

Each receptacle 124 includes a connector 128 configured to receive a respective connector 118 at each closure 110. For instance, receptacle 124 may form a first connector 128 as a female connector configured to receive a second connector 118 at the closure 110 as a male connector. However, it should be appreciated that in other configurations, the first connector 128 may be configured as a male connector and the second connector 118 may be configured as a female connector.

In various embodiments, the connectors 118, 128 are multi-fiber integrated connectors, such as multi-fiber push-on connectors (MPO) or multi-fiber termination push-on (MTP) connectors configured to terminate a plurality of fibers (e.g., 12 fibers, 24 fibers, or multiples thereof, etc.) per connector 118, 128. Accordingly, each closure 110 at respective receptacles 124 is configured to connect a plurality of fibers (e.g., 12 fibers, 24 fibers, or multiples thereof, etc.). In the embodiment depicted, the hub 122 includes sixteen (16) receptacles 124. Accordingly, each connector body 120 may be configured to receive sixteen closures 110 and respective quantities of fibers. In various embodiments, the hub 122 may include between four (4) receptacles 124 and thirty-two (32) receptacles 124, or between twelve (12) receptacles 124 and twenty-four (24) receptacles 124.

One or more input cables 134 and output cables 136 are configured to extend into the volume 130 through an opening 142 formed through one or more walls 140 forming the volume 130. Each cable 134, 136 includes respective multi-fiber cable connectors 144, 146. The connector body 120 includes an input cable port 154 and an output cable port 156 each configured to receive respective input multi-fiber cable connector 144 from input cable 134 and output multi-fiber cable connector 146 from output cable 136. The neck 132 is coupled to the hub 122 to communicatively couple the ports 154, 156 to the plurality of receptacles 124. Accordingly, closures 110 inserted into respective receptacles 124 are communicatively coupled to ports 154, 156 and cables 134, 136.

In various embodiments, the closure 110 includes a closure body 112 including walls configured to house a connector 118. The body 112 may form a substantially polygonal (e.g., rectangular, or pentagonal, or hexagonal, etc.) cross-section body extending substantially along a vertical axis when positioned at the receptacle 124. The receptacle 124 may form a walled cavity extending into the hub 122. A distal end of the body 112 (relative to the connector 118) may form a cap 114 positioned outside of the receptacle 124. The cap 114 may include a protruded surface (e.g., extending radially from the body 112), such as to facilitate a user to grab and pull the closure 110 from the receptacle 124.

In some embodiments, the closure 110 may include an end wall 116 through which the connector 118 extends into and out of an interior of the closure 110 formed by body 112. Cap 114 may form an end wall distal to the end wall 116 along a longitudinal extension of the body 112. The closure 110 may include seals (e.g., gaskets, sealants, epoxies, adhesives, etc.), fits (e.g., press fits, snap fits, interference fits, etc.), or welds or brazes between body 112 and end wall 116 and/or cap 114, such as to mitigate or eliminate fluid communication between an exterior and interior of the closure 110. An interior of the closure 110 may include one or more platforms at which telecommunications modules (e.g., splitters, connectors, etc.) may be positioned within the closure 110. In some embodiments, telecommunications modules may be adhered to interior walls of the body 112. The connector 118 may be connected to the end wall 116. The body 112 may couple to the end wall 116 and components at the connector 118 may be operably connected to components at the body 112. A user may perform operations through an end at which cap 114 is positioned at the body 112.

Embodiments of the closure 110 provided herein include pre-terminated, pre-tested, and pre-sealed closures 110 (e.g., factory-terminated, tested, and sealed, in contrast to termination, testing, and sealing at an outside plant environment), each insertable into respective receptacles 124 at the multi-receptacle hub 122. Embodiments of the closure 110 such as provided herein may eliminate a need for splicing by a technician at the volume 130 or in an outdoor (e.g., outside plant or OSP) environment. Embodiments of connectors 118, 128 provided herein may be configured as hardened connectors, such as appropriate for outdoor environments. Embodiments of the system 100 may eliminate a need for cumbersome, large fiber count closures, and outdoor splicing generally associated with fiber optic closures.

Embodiments of the closure 110 provided herein may counterintuitively provide a large quantity of closures 110 with smaller volumes and fewer fiber counts in contrast to single-closure systems including larger volumes and greater fiber counts. For instance, embodiments of the system 100 provided herein may provide dozens, hundreds, or thousands of fiber optic connections divided across a plurality of closures 110. Embodiments of the system 100 provided herein may advantageously improve access, ergonomics, reduce cost, and improve connector durability by providing robust, large-quantity, small-volume closures each having a quantity of fibers corresponding to a multi-fiber connector (e.g., a single MPO, MPT, etc. connector) in contrast to a single closure including a plurality of fibers received from an input cable or pluralities of multi-fiber connectors.

In an exemplary embodiment, system 100 is configured to receive one or more input cables 134. The multi-receptable hub 122 includes a plurality of receptacles 124 each configured to receive a respective pre-terminated, tested, and sealed closure 110. Each closure 110 includes a range of optical fiber connections corresponding to a subdivision of total connections at the multi-fiber receptacle hub 122. For instance, the hub 122 may be configured to receive the plurality of closures 110 totaling up to (864) fibers, or up to (3456) fibers, or up to (6912) fibers, or more, such as may be based on fiber type, splicing, or other configuration (e.g., single or mass fusion, ribbon type, diameter, etc.). The hub 122 divides the total quantity of fibers across the plurality of closures 110. For instance, each closure 110 may be pre-terminated, tested, sealed, and configured to provide (54) fiber connections, or (216) fiber connections, or (432) fiber connections, or more, and the hub 122 may be configured to include (16) receptacles 124. Accordingly, in such an embodiment, the hub 122 including (16) receptacles 124 may have (16) closures 110 selectively installed, with a total of up to (6912) fibers. A user may initially include one closure 110 and further expand the quantity of connections by operably coupling additional closures 110. The user may expand the quantity of connections through the connection of additional closures 110 to the hub 122 without requiring on-site opening of a closure (e.g., breaking a seal), terminating, and re-sealing.

Although the foregoing exemplary embodiment includes certain quantities of fibers per closure 110, it should be appreciated that embodiments of the system 100 may include evenly distributed or un-evenly distributed quantities of fibers and connections across the plurality of closures 110. For instance, a first plurality of closures 110 may be configured to include a first fiber count, and a second plurality of closures 110 may be configured to include a second fiber count different from the first fiber count. Respective first receptacles 124 may be configured to receive the first plurality of closures 110 and respective second receptacles 124 may be configured to receive the second plurality of closures 110.

Handholes and closures in accordance with various embodiments of the present disclosure may further include one or more features as disclosed in International Patent Application No. WO 2021/146472A1; U.S. Pat. Nos. 11,008,134; 11,066,802; 11,561,354; U.S. patent application Ser. Nos. 17/223,089; 17/224,155; and/or 17/322,120, the disclosures of all of which is incorporated by reference herein in their entireties.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A handhole system, the system comprising:
a plurality of walls forming a handhole volume, wherein one or more of the plurality of walls forms an opening through which an input cable and an output cable is extendable into the volume;
a plurality of closures, wherein each closure comprises a sealed body including a multi-port connector;
a connector body comprising a hub, the hub comprising a plurality of receptacles comprising a plurality of connectors configured to receive respective multi-port connectors from the plurality of closures, the connector body comprising a neck comprising an input cable port configured to receive an input cable connector from the input cable and an output cable port configured to receive an output cable connector from the output cable, wherein the neck is coupled to the hub to communicatively couple the input cable port and output cable port to the plurality of receptacles at the hub, and wherein the plurality of receptacles is configured to communicatively couple respective closures to the input cable and the output cable.

2. The handhole system of claim 1, wherein the connector body comprises a base coupled to the neck.

3. The handhole system of claim 1, wherein the hub is configured in pivoting arrangement relative to a ground and vertical axis, wherein the hub is configured to position the plurality of receptacles at an oblique angle between the ground and the vertical axis.

4. The handhole system of claim 1, wherein each connector at the hub and the closure comprises a 12 fiber multi-fiber connector or 24 fiber multi-fiber connector.

5. The handhole system of claim 4, wherein the hub comprises between four receptacles and thirty-two receptacles.

6. The handhole system of claim 5, wherein the hub comprises between twelve receptacles and twenty-four receptacles.

7. The handhole system of claim 1, wherein the closure is configured as a pre-terminated and pre-sealed closure.

8. The handhole system of claim 1, the closure comprising a substantially polygonal cross-section body extending substantially along a vertical axis when positioned in the receptacle.

9. The handhole system of claim 1, wherein the plurality of receptacles forms a walled cavity extending into the hub along a vertical axis.

10. The handhole system of claim 1, the closure comprising an end wall through which the connector is extended from the exterior to the interior of the closure, the end wall positioned at a first end of the body and a cap positioned at a distal end of the body from the end wall.

11. The handhole system of claim 10, wherein the end wall, the cap, and the body comprises one or more seals, fits, welds, or brazes therebetween.

12. A quick connect telecommunications system, the system comprising:
   a plurality of closures, wherein each closure comprises a sealed body including a multi-port connector; and
   a connector body comprising a hub, the hub comprising a plurality of receptacles extending into the hub, wherein each receptacle comprises a respective connector configured to receive respective multi-port connectors from the plurality of closures, the connector body comprising a neck comprising an input cable port configured to receive an input cable connector from the input cable and an output cable port configured to receive an output cable connector from the output cable, wherein the neck is coupled to the hub to communicatively couple the input cable port and output cable port to the plurality of receptacles at the hub, and wherein the plurality of receptacles is configured to communicatively couple respective closures to the input cable and the output cable.

13. The system of claim 12, wherein the connector body comprises a base coupled to the neck.

14. The system of claim 12, wherein the hub is configured in pivoting arrangement relative to a ground and vertical axis, wherein the hub is configured to position the plurality of receptacles at an oblique angle between the ground and the vertical axis.

15. The system of claim 12, wherein each connector at the hub and the closure comprises a 12 fiber multi-fiber connector or 24 fiber multi-fiber connector.

16. The system of claim 15, wherein the hub comprises between two receptacles and thirty-two receptacles.

17. The system of claim 12, the closure comprising a substantially polygonal cross-section body extending substantially along a vertical axis when positioned in the receptacle.

18. The system of claim 12, wherein the plurality of receptacles forms a walled cavity extending into the hub along a vertical axis.

19. The system of claim 12, the closure comprising an end wall through which the connector is extended from the exterior to the interior of the closure, the end wall positioned at a first end of the body and a cap positioned at a distal end of the body from the end wall.

* * * * *